Figure 1:
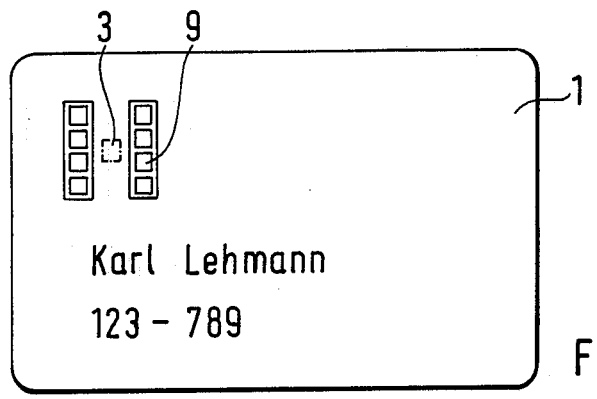

United States Patent [19]

Haghiri-Tehrani et al.

[11] Patent Number: 4,966,857
[45] Date of Patent: Oct. 30, 1990

[54] DATA CARRIER HAVING AN INTEGRATED CIRCUIT AND A METHOD FOR PRODUCING SAME

[75] Inventors: Yahya Haghiri-Tehrani; Joachim Hoppe, both of Munich, Fed. Rep. of Germany

[73] Assignee: GAO Gesellschaft fur Automation und Organisation mbH, Munich, Fed. Rep. of Germany

[21] Appl. No.: 285,656

[22] Filed: Dec. 16, 1988

Related U.S. Application Data

[60] Division of Ser. No. 106,890, Oct. 13, 1987, Pat. No. 4,792,843, which is a continuation of Ser. No. 752,072, filed as PCT EP84/00315 on Oct. 9, 1984, abandoned.

[30] Foreign Application Priority Data

Oct. 24, 1983 [DE] Fed. Rep. of Germany ....... 3338597

[51] Int. Cl.⁵ ............................................. H01L 23/28
[52] U.S. Cl. ..................................... 437/209; 283/83; 283/904; 428/76; 428/203; 235/380
[58] Field of Search .................. 437/209; 283/904, 83; 428/76, 203; 235/380

[56] References Cited

U.S. PATENT DOCUMENTS

| | | |
|---|---|---|
| 4,222,516 | 9/1980 | Badet et al. . |
| 4,380,699 | 4/1983 | Monnier et al. . |
| 4,460,825 | 7/1984 | Haghiri-Tehrani et al. . |
| 4,587,413 | 5/1986 | Hoppe et al. . |

FOREIGN PATENT DOCUMENTS

| | | |
|---|---|---|
| 0068539 | 1/1983 | European Pat. Off. . |
| 0071255 | 2/1983 | European Pat. Off. . |
| 0110518 | 6/1984 | European Pat. Off. . |
| 2659573 | 7/1977 | Fed. Rep. of Germany . |
| 3029667 | 3/1982 | Fed. Rep. of Germany . |
| 3123198 | 8/1982 | Fed. Rep. of Germany . |
| 8221495.6 | 1/1983 | Fed. Rep. of Germany . |
| 2390008 | 1/1978 | France . |
| 2520541 | 7/1983 | France . |
| 2081974 | 2/1982 | United Kingdom . |
| 2164794 | 9/1984 | United Kingdom . |

OTHER PUBLICATIONS

Siemens-Bauteile, Rept. 16(1978), No. 2, pp. 40-44.
Electronique Industrielle, May 1, 1981, pp. 87-88.

*Primary Examiner*—Olik Chaudhuri
*Assistant Examiner*—Andrew Griffis
*Attorney, Agent, or Firm*—Bacon & Thomas

[57] ABSTRACT

A method of making a laminated multi-layer data carrier includes laminating a core layer, an intermediate substrate carrying an IC module, electrical contact pads, and electrical leads connecting the IC module to the contact pads, and a cover layer having contact apertures therein together under heat and pressure so that the IC module is pressed into the core layer and protected within the central core of the carrier while the contact pads are pressed outwardly into the apertures of the cover layer so that the contact pads are flush with the surface of the cover layer. Alternative embodiments are described wherein the core layer supports the contact pads in the apertures of the cover layer and where the laminating process is carried out such that the substrate is anchored between the core and cover layers.

4 Claims, 4 Drawing Sheets

DATA CARRIER HAVING AN INTEGRATED CIRCUIT AND A METHOD FOR PRODUCING SAME

This application is a division of application Ser. No. 106,890, filed Oct. 13, 1987, now U.S. Pat. No. 4,792,843, which is a continuation of Ser. No. 752,072, filed as PCT EP84/00315 on Oct. 9, 1984, now abandoned.

The present invention relates to a multilayer data carrier comprising at least a core layer and an upper and lower cover layer, an IC module for processing electrical signals, and contact surfaces and leads for connecting the IC module with external devices, the IC module, contact surfaces and leads being arranged together on a substrate, the contact surfaces and leads being made of a thin electrically conducting coating of the substrate and the substrate being embedded between the core and cover layers in such a way that the IC module is located in a recess in the core layer and the contact surfaces are present in at least one recess in the upper cover layer.

Data carriers such as credit cards, identification cards and so on, which have an integrated circuit are increasingly used in automatic merchandise and service trade. Communication of the integrated circuit with corresponding machines is carried out in the most simple manner via galvanic contacting. For this purpose conductive coatings (contact surfaces) are provided on the card, which, on the one hand, are connected via leads with the circuit in the card and, on the other hand, allow for electrical connection with an external device via an appropriate contact head. The circuit itself is preferably disposed in the center of the identification card, while the contact surfaces are flush with the surface of the card. When designed in this manner, the contact surfaces can be kept free of contamination most simply during daily use of the card.

In the following, a few of the many identification cards having an integrated circuit and galvanic contacting which have become known already, shall be mentioned.

In German Offenlegungsschrift No. 26 59 573, the IC module is disposed on a flat, non-flexible substrate together with the leads and the contact surfaces To incorporate the substrate into an identification card, the IC module is positioned in a recess in the card and the edges of the flat substrate connected to the card. Since the contact surfaces are disposed with the circuit on the same substrate, they are located, in the identification card, on the plane of the circuit, i.e. approximately in the center of the card. Access to the contact surfaces is thus possible only via depressions in the card surface. Since dirt tends to collect chiefly in these depressions, they are filled, as proposed in German Offenlegungsschrift No. 26 59 573, with a conductive material which is then flush with the surface of the card.

The raising of the contact surfaces, achieved by filling in the recesses in the card, may also be carried out separately from the production of the card during the production of the carrier substrate for the circuit.

In this connection German Offenlegungsschrift No. 30 29 667 must be mentioned, in which the contact surfaces of the carrier substrate or the carrier element are provided with electrically conductive bumps before being incorporated into a card. When the card is being completed, the carrier element is inserted into a window in this card and laminated with a cover film having recesses in the area of the bumps. The height of the conductive bumps corresponds to the thickness of the cover film, so that the contact surfaces are flush with the surface of the finished card.

The above-mentioned solutions have in common that the arrangement of the contact surfaces on the surface of the card requires additional procedural steps and additional material resources. Furthermore, due to the use of raised contacts in the known solutions, an additional transition point between the contact surfaces proper of the carrier substrate and the contact surfaces accessible on the finished card cannot be avoided, which basically creates an additional source of danger for disturbances.

This additional transition point can be avoided when the carrier element, as described in German Offenlegungsschrift No. 31 23 198, has bendable contact tags protruding freely beyond the edge of the carrier, which are directed through slits in the cover film and folded back when the card is put together. When the card layers are laminated under heat and pressure, the contact tags are pressed into the cover film and are flush with the surface of the finished card. Attention must be paid, in this method, that the relatively thin contact tags do not kink when they are directed through slits in the cover film. The proposed method is thus less suitable for mass production of identification cards with integrated circuits.

The problem on which the invention is based is therefore to propose an identification card having an IC module, in which the contact surfaces are located on the surface of the card while the module itself is mounted approximately in the center of the card. Unlike the known cards, this identification card should be easy and thus inexpensive to produce, so that it can be economically manufactured in large quantities. Furthermore, sources of danger which might disturb the operation of the IC module should be avoided to as great an extent as possible. Further, a method for production and a carrier element for an IC module to be incorporated into a data carrier are also proposed.

This problem is solved according to the invention by the features stated in the main claim.

In an advantageous embodiment of the invention, the IC module is mounted on a flexible carrier film having high thermostability and high tensile strength, the substrate. The circuit is connected in a recess in the substrate to leads which protrude into the recess. The leads end on the substrate in contact surfaces, the leads and contact surfaces being made of a thin, electrically conductive coating of the substrate. The contact surfaces are arranged, for example, collected into two groups on each side of the circuit on the substrate. The identification card comprises three layers. The middle layer or core layer is provided with a recess adapted to the circuit. The upper cover layer has two recesses or apertures which are punched congruently to the dimensions of the contact groups.

While the card layers are being pressed together or laminated, the flexible substrate is deformed in such a way, essentially due to the recesses in the various layers of the card, that the module has a protected location in the center of the finished card, while the contact surfaces are flush with the surface of the card. The very simple card construction combined with the use of an equally simple and inexpensively produced carrier element comprising the substrate, the IC module, the leads and contact surfaces allow for the economic production of an identification card having an IC module, especially in large quantities. The material resources required for the known identification cards and, above all, the labor resources which in certain respects far exceed those in conventional card production, as explained above, are unnecessary in the case of the inventive card. Furthermore, it is ensured that the contact surfaces are directly connected via leads to the circuit, thereby avoiding sources of danger for disturbances due to additional contacting or connecting points.

Further advantageous embodiments of the invention are characterized by different designs of the recesses in the upper cover film with respect to the contact areas of the carrier element, or by different techniques for attaching the carrier element in the card.

In the following, the embodiments and further advantages and developments of the invention shall be described in more detail with reference to the adjoined drawings.

Figure 2:
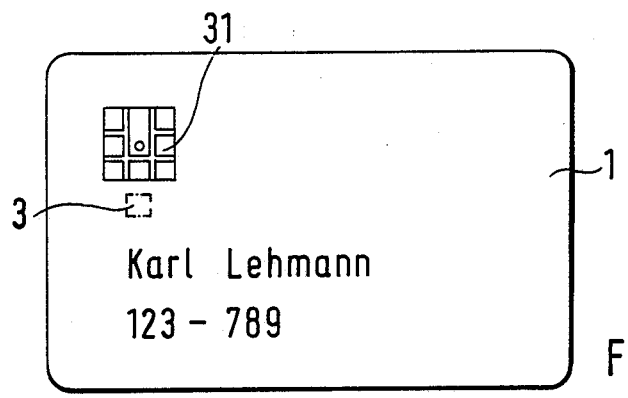
Figure 3:
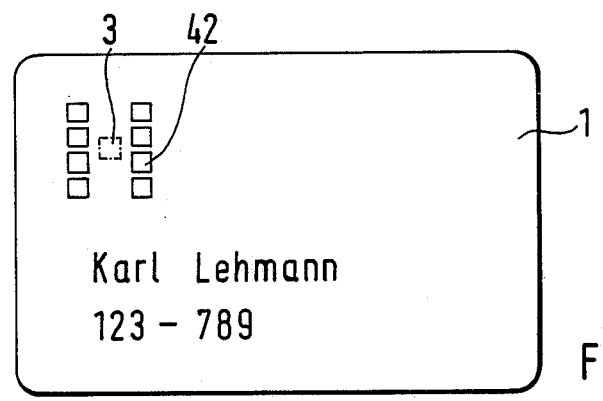
Figure 4:
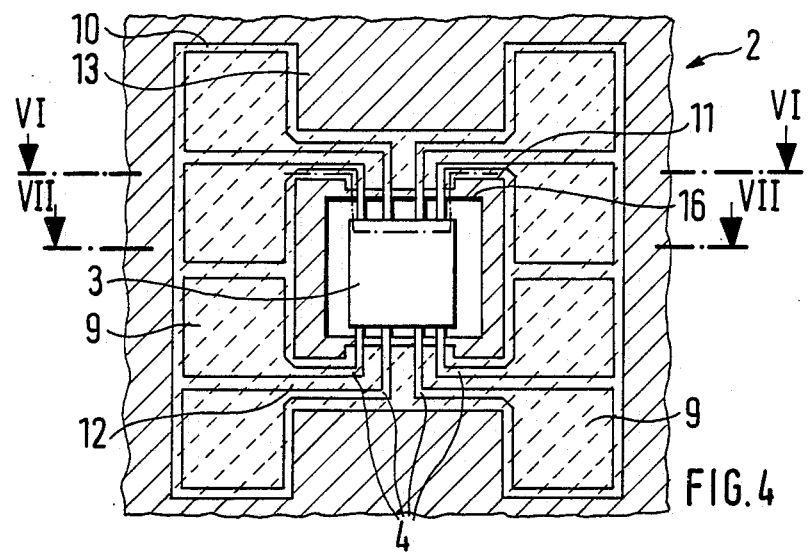
Figure 5:
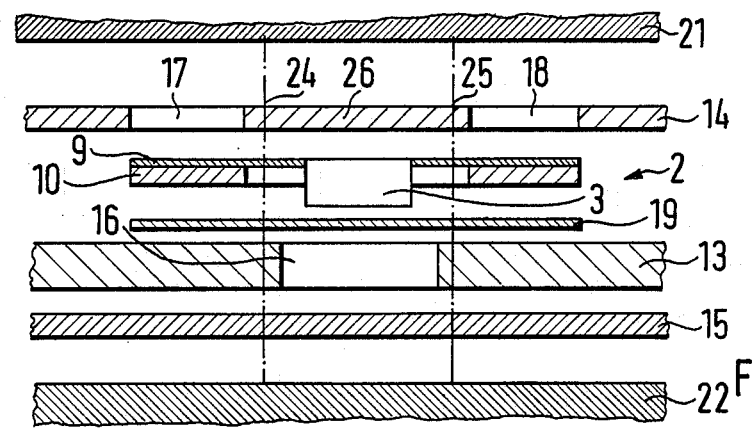
Figure 6:
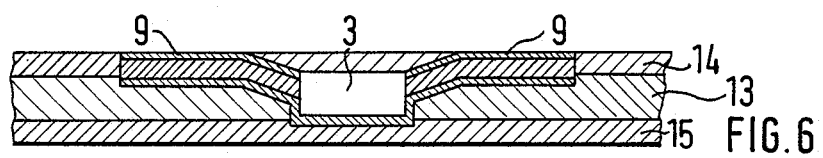
Figure 7:
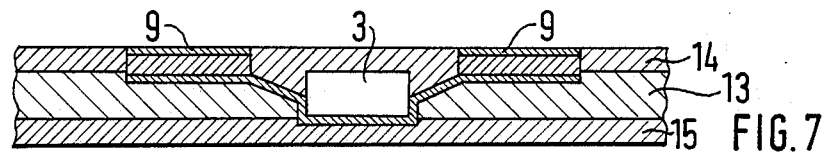
Figure 8:
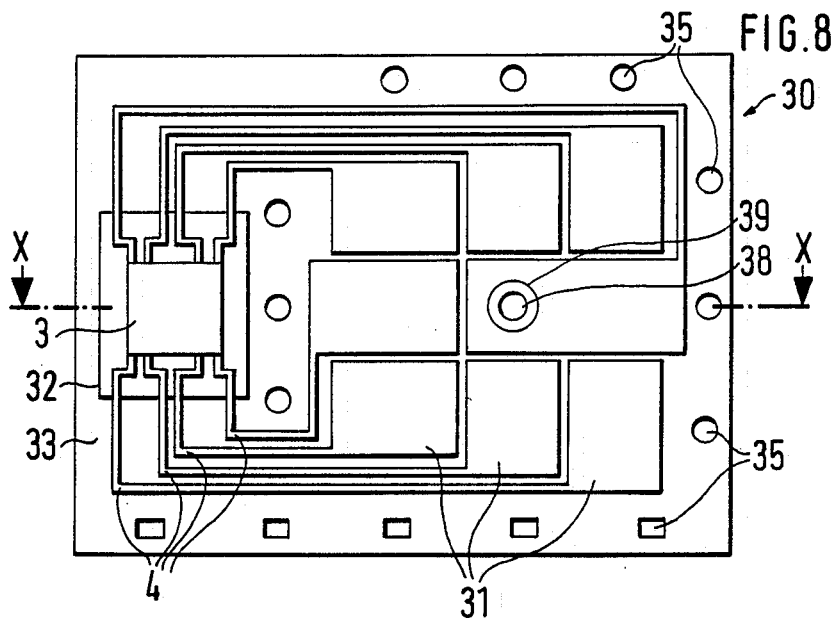
Figure 9:
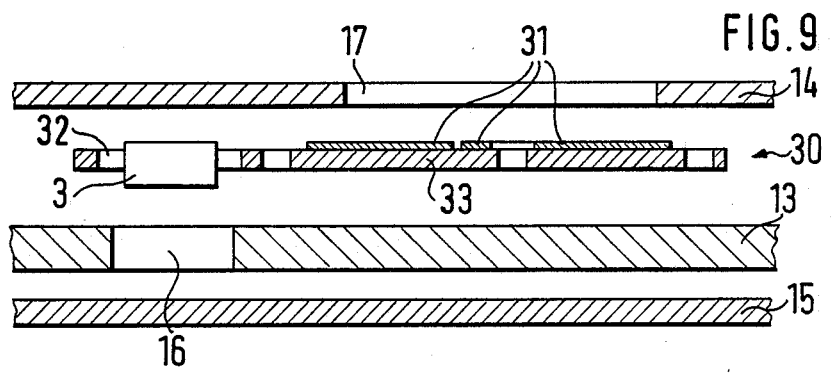
Figure 10:
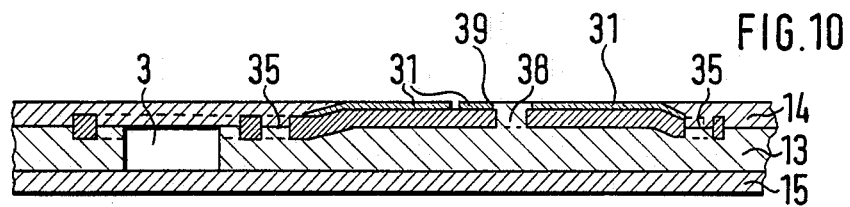
Figure 11:
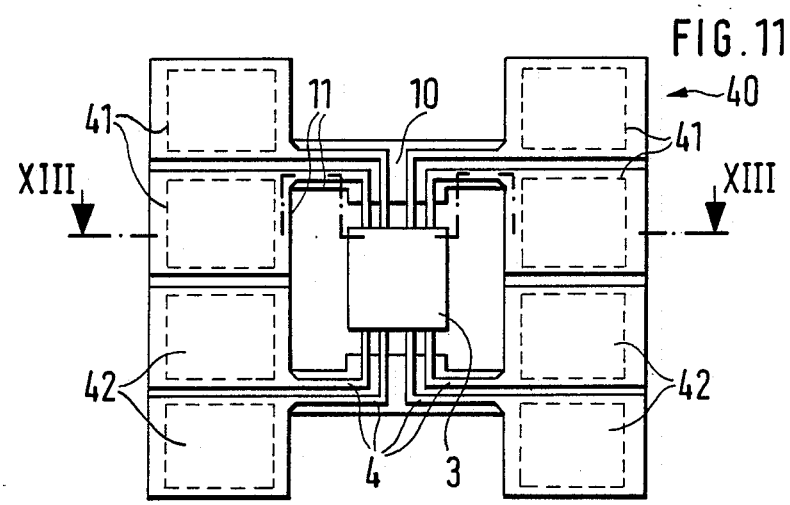
Figure 12:
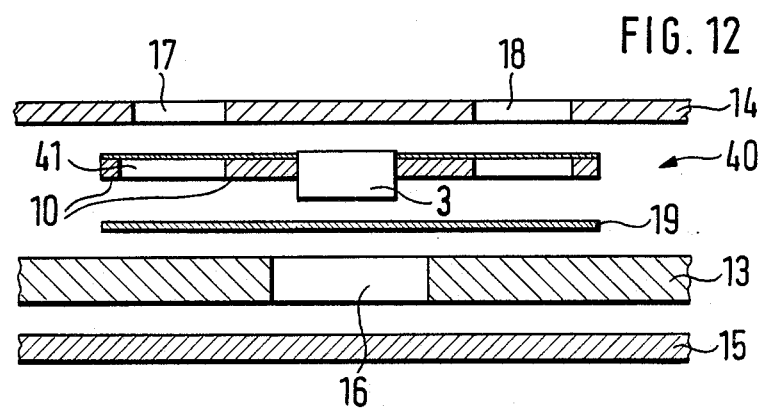
Figure 13:
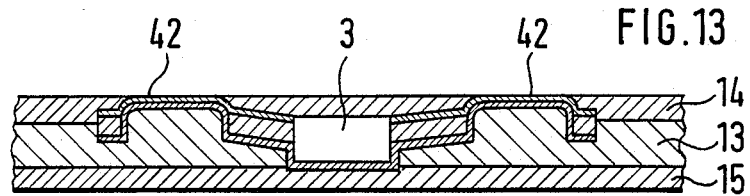

These show:

FIGS. 1, 2, 3 identification cards with embedded IC modules in three different embodiments, FIG. 4 the identification card as in FIG. 1 with a detailed view of the carrier element;

FIG. 5 the identification card as in FIG. 4 in cross-section before the various layers are joined together;

FIG. 6 the finished identification card in cross-section along the line 6—6 of FIG. 4;

FIG. 7 the finished identification card in cross-section along the line 7—7 of FIG. 4;

FIG. 8 a detailed view of a carrier element to be incorporated into an identification card as in FIG. 2;

FIG. 9 the identification card as in FIG. 2 in cross-section before the various layers are joined together;

FIG. 10 the finished card in cross-section along the line 10—10 of FIG. 8;

FIG. 11 a detailed view of a carrier element to be incorporated into an identification card as in FIG. 3;

FIG. 12 the identification card as in FIG. 3 in cross-section before the various layers are joined together;

FIG. 13 the finished identification card in cross-section along the line 13—13 of FIG. 12.

FIGS. 1, 2 and 3 each show an identification card having an integrated circuit disposed on a substrate, the position of the IC module and the contact surfaces, and the design of the apertures in the upper cover film of the card varying in each case. In the lower area of the card, the name of the card owner and a card number are printed, for example. For the sake of clarity, no further characters or printed patterns which are usual in such cards have been shown. In the following, the details of the identification cards shown in FIGS. 1, 2 and 3 shall be dealt with in connection with the description of the various embodiments.

FIGS. 4, 5, 6 and 7 show a first embodiment of the invention before and after the various card layers are pressed together. The finished identification card corresponds to the card shown in FIG. 1. First, the construction of carrier element 2 shall be explained, which is shown from the top in FIG. 4 and in cross-section in FIG. 5. Carrier element 2 comprises IC module 3, leads 4, contact path with contact surfaces 9 and substrate 10. IC module 3 is connected in a recess 11 in substrate 10 with the ends of leads 4 which protrude into the recess, and is held in the window solely by the attachment of the leads to the corresponding connection points in the module. This type of attachment or bonding of semiconductor elements with leads which are etched out of a conductive coating of the substrate has been known for some time and has proved its worth in practice (see also Siemens-Bauteile-Report 16 (1978), No. 2, pages 40-44).

In the case of the carrier element used for the inventive identification card, leads 4 end in contact surfaces 9 disposed on substrate 10, the dimensions of the leads being selected in such a way that direct contacting is possible in an automatic machine using a suitable sensing head. Four contact surfaces are arranged on each side of IC module 3 collected in groups. Substrate 10, which is made of flexible, thermostable and non-ductile material, for example polyimide, is punched in such a way that essentially only the area necessary for the contact surfaces and leads is underlaid by film material. The contact groups are connected via relatively narrow substrate webs 12 with the substrate area in which the IC module is disposed.

FIG. 5 shows the various elements of the identification card before the layers are laminated. Upper cover film 14 has approximately the thickness of substrate 10 including contact surfaces 9 and is provided with two apertures 17, 18. The apertures are dimensioned in such a way that they can each take up a group consisting of four contact surfaces. The middle card layer or core layer 13 has a recess 16 (see also FIG. 4) which is slightly larger than the IC module. Lower cover film 15 closes off the identification card on the back. When, as shown in this embodiment, substrate 10 is made of a material (such as polyimide) which does not connect with the material of the identification card (for example, PVC) when the layers are pressed together under heat and pressure, suitable elements must be provided to connect the different materials. In such a case, a so-called "fusion adhesive" in the form of a film 19 may be used. With the help of such an adhesive, different synthetic materials such as polyimide and PVC may be stuck to each other permanently under the effect of heat and pressure.

The layer construction shown in FIG. 5 is pressed together, as is usual in the case of conventional card production, using two steel plates 21, 22 under the effect of heat and pressure. In the initial phase of lamination, the pressure of the laminating plates acts predominantly on the points of greatest accumulation of material in the laminate. These are the areas indicated by dot-dash lines 24, 25, where lower cover layer 15, core layer 13, fusion adhesive film 19, substrate 10 and upper cover layer 14 are located one above the other. Due to this distribution of pressure, IC module 3 and the connection points of leads 4 with the IC module are initially relieved. In the course of lamination the fusion adhesive film softens, thereby form-fitting the geometrical structure formed by IC module 3, leads 4 and substrate 10. The card layers also soften subsequently. Since the material of substrate 10 does not soften in the range of the laminating temperatures, it is embedded between core film 13 and upper cover film 14 at the points indicated by lines 24, 25, displacing the softening card material. IC module 3 is pressed into recess 16 of core film 13 due to web 26 of cover film 14 located between apertures 17, 18, while the parts of substrate 10 provided with contact surfaces 9 give way and enter apertures 17 and 18 in upper cover film 14. During this phase, in which recess 16 of the core film is finally filled in with card material almost completely, the very soft fusion adhesive film 19 offers a protective buffer zone for IC module 3 and leads 4.

FIGS. 6 and 7 show the finished identification card. FIG. 6, a cross-sectional drawing along the line 6—6 of FIG. 4, clearly shows the deformation of substrate 10, which leads to IC module 3 having a protected location in the center of the card while contact surfaces 9 are flush with the surface of the card. Fusion adhesive 19 ensures reliable adhesion of substrate 10 to the card especially in the area of contact surfaces 9 after the laminate has cooled off. FIG. 7, a cross-sectional drawing along the line 7—7 of FIG. 4, shows that upper cover film 14 and core film 13 are connected with each other through recess 11 of substrate 10, which is designed so as to be as large as possible, so that upper cover film 14 is firmly connected with the card core in the environment of IC module 3. The already-mentioned relatively narrow connecting webs 12 between each contact group and the substrate area in which the IC module is located facilitate the deformation of the substrate.

In the following, a card, or the incorporation of a carrier element in a card, as already shown in FIG. 2, shall be described. In this embodiment all contact surfaces are located on one side of the substrate while the IC module is disposed on the other side. In this case relatively thick IC modules, for example, may be disposed in the area provided for high-embossing in the identification card, while the contact surfaces are located in the usual place so as to claim the area provided for embossing as little as possible.

FIG. 8 shows a carrier element 30 from the top, in which IC module 3 and contact areas 31 are separate. The IC module is disposed in a recess 32 in substrate 33 and held in this recess by self-supporting leads 4. The leads connect IC module 3 with contact surfaces 31. The number and arrangement of the contact surfaces depend on the IC module used, and may be adapted to the particular needs at hand. FIG. 8 shows by way of example an embodiment with 8 contact areas. In FIG. 8, several small holes 35, 38 may be seen distributed over substrate 33, which serve to anchor the substrate between the various card films.

FIG. 9 shows the carrier element 30 described and the three card layers before assembly in a cross-sectional view along the line 10—10 of FIG. 8. Core film 13 has a recess 16 in the area of IC module 3, the periphery of this recess having virtually the same size as recess 32 in the substrate. The upper cover film has an aperture 17 in the area of the contact surfaces, this aperture being smaller than the substrate area bearing contact surfaces 31. The lamination under the effect of heat deforms carrier element 30, as shown in FIG. 10, in such a way that the substrate area bearing the contact surfaces is shifted towards the surface of the card relative to the IC module, so that IC module 3 has a position in the middle of the card protected by the two card cover films 14, 15 while contact surfaces 31 are flush with the surface of the card. It has turned out, surprisingly enough, that core film 13 embeds the edges of the substrate, on the one hand, and presses the contact areas up through aperture 17 to the outside surface of the layer construction, on the other.

Since the substrate has a large periphery in the area of the contact surfaces in comparison with recess 17 in upper cover film 14, the edges of the substrate are anchored between upper cover film 14 and core layer 13. In areas of the substrate which do not have any contact surfaces, for example the left-hand portion shown in FIG. 10, the substrate is embedded between the core and upper cover films in any case.

The IC module is shifted downwards into recess 16 of core film 13 in the finished card. The expansion of leads 4 required for this change of position is braced by the diagonal design provided in the area of recess 32.

It can be seen further in FIG. 10 that thermoplastic material of core film 13 and upper cover film 14 has flowed in in the area of holes 35 and connected itself. This intimate connection anchors the interjacent carrier element firmly in the card compound. Material of core layer 13 also flows through hole 38 in the area of the contact surface due to the applied pressure, until it is flush with the surface of the card.

Since recess 39 in the metallic contact surface is larger than hole 38 in the substrate, a plug with a T-shaped cross-section is formed, which connects the substrate additionally with the core film in the contact surface area. This embodiment is particularly advantageous when the contact area is large.

FIG. 11 shows a carrier element 40 which is chiefly suitable for a further embodiment. It is similar in many points to the carrier element described in detail in FIG. 4. For example, IC module 3 is disposed in a recess 11 in substrate 10 and connected via leads 4 to contact surfaces 42. The only difference is that the metallic contact surfaces 42 are not completely underlaid by substrate 10. Dotted lines 41 indicate the recesses provided in the substrate under each contact surface.

FIG. 12 shows carrier element 40 in a cross-sectional view along the line 13—13 shown in FIG. 11 before incorporation into the card, together with the three card films. Core film 13 and upper cover film 14 exhibit the known and apertures for taking up the IC module and contact surfaces. It is expedient for the described embodiment to underlay carrier element 40 with an adhesive layer 19 before it is incorporated into the card. The properties of this adhesive layer have already been described in detail above.

After core layer 13 has softened, substrate 10 is deformed towards the center of the card in the area of IC module 3, while the thermoplastic material of the card gives way and enters apertures 17, 18 in the upper cover film. In the process, metallic contact surfaces 42 are deformed towards the surface by the core material.

The expansion involved in the deformation is compensated by contact surfaces 42 designed as thin metal layers. In case the contact surfaces cannot compensate the expansion, for example using a relatively thick cover film, it must be ensured that the linear expansion is compensated in a different way. For example, the connection of the metallic contact surfaces 42 with substrate 10 can be designed in the edge area of the carrier element in such a way that this connection comes apart when subjected to tensile stress, making the metallic contact surfaces freely movable on one or more sides.

A further embodiment consists in leaving out a large area of substrate 10 across several contact surfaces 42. For example, the contact areas of carrier element 40 shown in FIG. 11 may be underlaid only by narrow strips of substrate material on the outer longitudinal sides, or those facing the IC module, in order to obtain the same result as in the above-described embodiment.

In cases in which it is undesirable or impossible to apply the fusion adhesive, which is usually done under the effect of heat, the fusion adhesive may be replaced by a material in the form of a film or pieces of film, which is connected with the substrate by means of an adhesive effective at room temperature. This film material is selected in such a way that it is intimately connected with the card material during lamination under the effect of pressure and heat. Preferably, the same material is selected as was used for the rest of the layer construction, for example PVC. An advantage of this type of connection between the substrate and the card layers is that the deformation of the carrier element can be effectively supported by selectively applying the film material to the areas of the carrier element which are to be deformed during lamination.

The carrier element described is exposed to different mechanical stresses both during production of the data carrier and during the use thereof.

The mechanical stresses acting upon the carrier element during lamination arise primarily in the areas of the carrier element which are deformed during the laminating process. The subsequent functioning of the data carrier can be adversely affected in particular by the mechanical forces acting upon the IC module or the leads.

The stresses acting, upon the IC module during production of the card are taken care of according to the invention in the following manner. The compressive stresses present during lamination are kept away from the IC module due to its arrangement in a cavity in the layer construction so that no direct compressive stresses are applied to the IC module at least before the card material softens.

The mechanical stresses acting upon the leads provided between the IC module and the contact surfaces are also protected against tensile and deformation forces by special protective measures. The areas of the leads which are deformed during the laminating process are underlaid by thermostable materials with high tensile strength and firmly connected thereto in such a way that the forces arising during deformation are kept away from the sensitive leads and/or absorbed by the reinforcing material. The areas of the leads not underlaid by substrate, in the area of the recess in the substrate, are held in a stable position by a strip of the cover film during the laminating process so that the deformation forces are kept relatively small in this area.

As has been shown by extensive experiments, the mechanical stresses present during the use of the data carrier are mainly due to bending stresses in the longitudinal or diagonal direction of the card. The bending stresses acting in the direction of the width of the card are of less significance. Damage to the carrier element is prevented according to the invention by completely underlaying at least the leads extending in the direction of the main axes of stress, i.e. the longitudinal or diagonal direction of the card, with thermostable film material having high tensile strength, and firmly connecting them thereto. The areas of the leads which are not underlaid by substrate are preferably led toward the contacting points of the IC module parallel or along the short edges of the data carrier.

Depending on which applications the data carrier is produced for, the various types of stress can be selectively taken into account by specially designing the carrier element or specially designing the substrate and by arranging the contact surfaces, the leads and the IC module on the substrate accordingly. In the case of a carrier element as shown in FIG. 4 or FIG. 11, which is embedded in the data carrier as in the view of FIG. 1 or FIG. 3, both the mechanical stresses arising during production and those arising during the use of the card are taken into account in this way, for example. This kind of construction is recommended in particular for data carriers which are subjected to particularly strong mechanical stresses over a longer period of time.

The carrier element shown in FIG. 8 and incorporated into the data carrier in accordance with FIG. 2, on the other hand, primarily takes the stresses arising during the production of the card into account. This kind of construction may be particularly useful, influenced by various marginal conditions such as the addition of a magnetic stripe on the back of the card. It is completely safe in particular when the data carrier is exposed to stresses which are less strong during its subsequent use due to a shorter period of validity or more careful handling.

We claim:

1. A method of making a laminated, multi-layer data carrier including at least a core layer including a planar top surface and a recess, an upper cover layer including apertures and a carrier element including a flexible film substrate carrying an IC module, electrical contact pads formed as a thin electrically conductive coating on the substrate, and electrical leads connecting the contact pads to the IC module, the method comprising:

(a) positioning the substrate with the contact pads, leads and IC module on the top surface of the core layer so that the IC module is disposed in the area of the recess in the core layer;

(b) positioning the upper cover layer above the substrate, IC module, leads and contact pads so that the cover apertures are aligned with the contact pads;

(c) laminating the core layer, substrate and cover layer together by using heat and pressure;

(d) at least the core layer being a thermoplastic material and said step of laminating using heat and pressure including softening said core layer to cause it to flow towards the apertures of the cover layer beneath the contact pads and the substrate so that the substrate and contact pads are pressed into the apertures until the contact pads are flush with the outer surface of the cover layer and so that the IC module is positioned substantially within the recess of the core layer.

2. A method of making a laminated, multi-layer data carrier including at least a core layer including a planar top surface and a recess, an upper cover layer including apertures, and a carrier element including a flexible film substrate carrying an IC module and a thin film electrically conductive layer, the electrically conductive layer overlying apertures in the substrate at least in areas defining contact pads, and electrical leads connecting the contact pads to the IC module, the method comprising:

(a) positioning the substrate with the contact pads, leads and IC module on the top surface of the core layer so that the IC module is disposed in the area of the recess in the core layer;

(b) positioning the upper cover layer above the substrate, IC module, leads and contact pads so that the cover apertures are aligned with the contact pads;

(c) laminating the core layer, substrate and cover layer together by using heat and pressure;

(d) at least the core layer being a thermoplastic material and said step of laminating using heat and pressure including softening said core layer to cause it to flow into the apertures in the substrate beneath the contact pads and to press and deform at least the contact pads into the cover apertures until the contact pads are flush with the outer surface of the cover layer and so that the IC module is positioned substantially within the recess of the core layer.

3. The method according to claim 1 or 2, including positioning a heat softening adhesive layer between the substrate and the core layer before the laminating step and laminating the adhesive layer with the core, substrate and cover layer, said adhesive layer covering at least the inner side of the IC module disposed away from the cover layer.

4. The method according to claim 2, wherein the substrate includes anchoring apertures, including laminating said core, substrate and cover layer together under heat and pressure as recited in steps (c) and (d) so that at least the core and cover layer materials are softened and enter into said anchoring apertures of said substrate to anchor the core, substrate and cover layers together.

* * * * *